United States Patent
Huang

(10) Patent No.: US 7,176,117 B2
(45) Date of Patent: Feb. 13, 2007

(54) METHOD FOR MOUNTING PASSIVE COMPONENTS ON WAFER

(75) Inventor: Min-Lung Huang, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 315 days.

(21) Appl. No.: 10/944,816

(22) Filed: Sep. 21, 2004

(65) Prior Publication Data

US 2005/0064625 A1 Mar. 24, 2005

(30) Foreign Application Priority Data

Sep. 23, 2003 (TW) ............................... 92126159 A

(51) Int. Cl.
*H01L 21/44* (2006.01)
*H01L 21/58* (2006.01)

(52) U.S. Cl. ..................... 438/614; 438/615; 438/617

(58) Field of Classification Search ................. 438/617
See application file for complete search history.

(56) References Cited

U.S. PATENT DOCUMENTS

| | | | |
|---|---|---|---|
| 6,753,609 B2 * | 6/2004 | Chien et al. ................. 257/761 |
| 7,081,404 B2 * | 7/2006 | Jan et al. ..................... 438/613 |
| 2003/0057559 A1 * | 3/2003 | Mis et al. .................... 257/762 |
| 2003/0119297 A1 * | 6/2003 | Lam et al. ................... 438/612 |
| 2003/0173680 A1 * | 9/2003 | Liao et al. ................... 257/777 |
| 2004/0012081 A1 * | 1/2004 | Kwon ......................... 257/678 |
| 2004/0127011 A1 * | 7/2004 | Huang et al. ................ 438/613 |
| 2004/0241906 A1 * | 12/2004 | Chan ........................... 438/107 |
| 2005/0017355 A1 * | 1/2005 | Chou et al. .................. 257/738 |

* cited by examiner

*Primary Examiner*—Stephen W. Smoot
(74) *Attorney, Agent, or Firm*—Birch, Stewart, Kolasch and Birch, LLP

(57) ABSTRACT

A method for mounting a passive component on a wafer. A passivation layer is disposed on a wafer having at least one first metal pad and at least one second metal pad thereon, which substantially exposes the first and second metal pads. A capping layer is formed on the exposed first metal pad, and an under ball metallurgy (UBM) layer is formed on the exposed second metal pad. A photoresist pattern layer is formed overlying the wafer to cover the capping layer and the passivation layer and expose the UBM layer. A solder bump is formed on the exposed UBM layer. After the photoresist pattern layer and the capping layer are successively removed, a passive component is mounted on the wafer through the solder bump.

20 Claims, 5 Drawing Sheets

METHOD FOR MOUNTING PASSIVE COMPONENTS ON WAFER

This Non-provisional application claims priority under 35 U.S.C. § 119(a) on Patent Application No(s). 92126159 filed in Taiwan, Republic of China on Sep. 23, 2003, the entire contents of which are hereby incorporated by reference.

BACKGROUND

The invention relates to a semiconductor packaging and in particular to a method for mounting passive components on a wafer.

Typically, the fabrication of microelectronic device comprises three main steps. First, a semiconductor substrate is provided by epitaxy technology. Second, integrated circuits are formed on the substrate, which comprises semiconductor devices and metal interconnects for electrical connection therebetween. Third, packaging is performed on the substrate to protect the integrated circuits on the substrate and provide a signal transmission interface for external circuits. In order to fabricate semiconductor devices with high integration for thin profile and lightweight electronic products, a variety of packaging technologies have been developed, such as ball grid array (BGA), wafer scale package (CSP), flip wafer, and multi-wafer module (MCM).

In semiconductor packaging, a wafer having integrated circuits thereon is diced into wafers or dies. Next, the wafer or die having bonding pads thereon is arranged on a carrier, such as a leadframe or a package substrate, by wire bonding or flip-wafer bonding. Generally, the passive component is mounted on the package substrate by surface mount technology (SMT) after packaging. The passive component is electrically connected to the integrated circuits on the wafer through the circuits on the package substrate.

Since the passive component mounted on the substrate is electrically connected to the integrated circuits on the wafer through the circuits on the package substrate, a long signal transmission path is created therebetween. As a result, the performance of semiconductor devices is reduced due to RC delay. A reduced signal transmission path between the passive component and the wafer is thus desirable to attain a semiconductor device with high performance and high integration.

SUMMARY

Embodiments of the invention provide a method for mounting a passive component on a wafer. A wafer having at least one first metal pad, at least one second metal pad, and a passivation layer thereon is provided. The passivation layer substantially exposes the first and second metal pads. A capping layer is formed on the exposed first metal pad. A metal layer is formed overlying the wafer to cover the capping layer, the passivation layer, and the exposed second metal pad. The metal layer is patterned to form an under ball metallurgy (UBM) layer over the second metal pad. A photoresist pattern layer is formed overlying the wafer to cover the capping layer and the passivation layer and expose the UBM layer. A solder bump is formed on the exposed UBM layer. The photoresist pattern layer and the capping layer are successively removed. A passive component is mounted on the wafer through the solder bump.

The first metal pad acts as a wire bonding pad and the second metal pad as a bumping pad.

Moreover, the capping layer may comprise polymer and have a thickness of more than 2000 Å. Additionally, the capping layer may comprise titanium, nickel, vanadium, or alloys thereof, with a thickness of more than 500 Å.

The UBM layer may further comprise titanium, chromium, nickel, vanadium, copper, aluminum, aurum, or alloys thereof. The solder bump comprises tin and can be formed by a printing and reflow process.

Embodiments of the invention further provide a method for mounting a passive component on a wafer. A wafer having at least one first metal pad, at least one second metal pad, and a passivation layer thereon is provided. The passivation layer substantially exposes the first and second metal pads. A capping layer is formed on the exposed first metal pad. A metal layer is formed overlying the wafer to cover the capping layer, the passivation layer, and the exposed second metal pad. A photoresist pattern layer is formed on the metal layer, exposing the metal layer over the second metal pad. A solder bump is formed on the exposed metal layer. The photoresist pattern layer is removed. The metal layer uncovered by the solder bump is removed to form an under ball metallurgy (UBM) layer on the second metal pad. The capping layer is removed. A passive component is mounted on the wafer through the solder bump.

The first metal pad acts as a wire bonding pad and the second metal pad as a bumping pad.

Moreover, the capping layer may comprise polymer and have a thickness of more than 2000 Å. Additionally, the capping layer may comprise titanium, nickel, vanadium, or alloys thereof, with a thickness of more than 500 Å.

Furthermore, the UBM layer may comprise titanium, chromium, nickel, vanadium, copper, aluminum, aurum, and alloy thereof. The solder bump comprises tin and can be formed by an electroplating and reflow process.

BRIEF DESCRIPTION OF THE DRAWINGS

Embodiments of the invention will become more fully understood from the detailed description given hereinbelow and the accompanying drawings, given by way of illustration only and thus not intended to be limitative of the invention.

DETAILED DESCRIPTION

First Embodiment

Figure 1A:
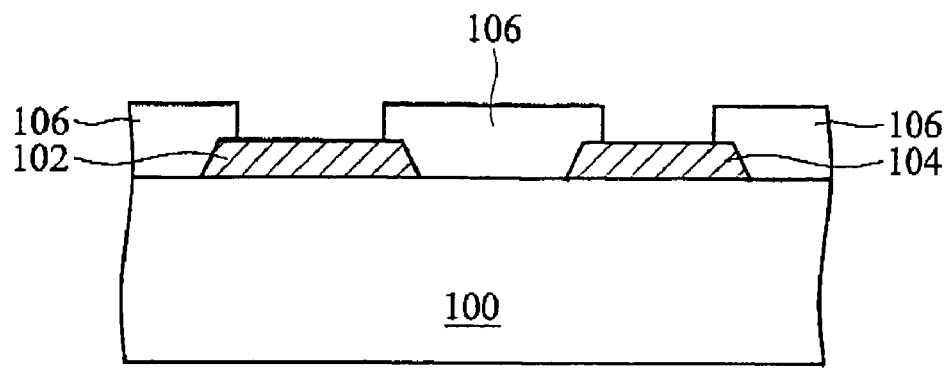
FIGS. 1A to 1E are cross-sections of a method for forming a wafer structure of a first embodiment of the invention.

FIGS. 1A to 1E illustrate a method for forming a wafer structure of a first embodiment of the invention. First, as shown in FIG. 1A, a wafer 100, such as silicon or other semiconductor material, is provided. The wafer 100 may contain a variety of elements, including, for example, MOS transistors, resistors, and other semiconductor elements as are well known in the art. The wafer 100 may also contain other insulating layers or metal interconnect layers. In order to simplify the diagram, a flat substrate is depicted. Here, the wafer 100 further comprises at least one first metal pad 102, at least one second metal pad 104, and a passivation layer 106 thereon. Moreover, the first and second metal pads 102 and 104 comprise aluminum or copper. In this embodiment, the first metal pad 102 acts as a wire bonding pad and the second metal pad 104 a bumping pad. The passivation layer 106 substantially exposes the first and second metal pads 102 and 104. The passivation layer 106 may comprise polyimide (PI) or silicon nitride formed by plasma enhanced chemical vapor deposition (PECVD).

Figure 1B:
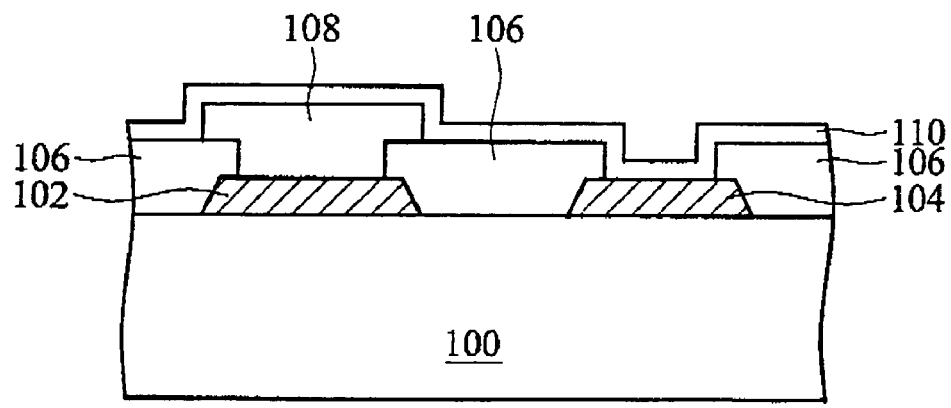

Next, as shown in FIG. 1B, a capping layer (not shown) is formed overlying the wafer 100 to cover the exposed first and second metal pads 102 and 104. Thereafter, lithography and etching are performed on the capping layer to leave a portion of the capping layer 108 over the first metal pad 102, which partially covers the passivation layer 106. In this embodiment, the remaining capping layer 108 protects the underlying first metal pad 102 during subsequent etching, which may comprise polymer or metal. For example, the capping layer 108 comprising polymer may have a thickness of more than 2000 Å. Moreover, the capping layer 108 comprising metal, such as titanium (Ti), nickel (Ni), vanadium (V), or alloys thereof, may have a thickness of more than 500 Å. Preferably, the metal selected for the capping layer 108 is different from the first metal pad 102 and the subsequent under bump metallurgy (UBM) layer.

An UBM layer 110 is formed overlying the wafer 100 by, for example, sputtering or chemical vapor deposition (CVD), to cover the exposed second metal pad 104, the passivation layer 106, and the capping layer 108. Generally, the UBM layer 110 may be a multiple metal layer comprising an adhesion layer, a barrier layer, and a wetting layer. In order to simplify the diagram only, a single layer is depicted. The adhesion layer improves adhesion between the second metal pad 104 and the passivation layer 106. The barrier layer prevents diffusion of metal atoms. The wetting layer increases wetness with the subsequent solder bump and prevents the underlying metal pad oxidized from being oxidized. In this embodiment, the material of the UBM layer 110 may comprise titanium (Ti), chromium (Cr), nickel (Ni), vanadium (V), copper (Cu), aluminum (Al), aurum (Au), or alloys thereof. Preferably, the UBM layer 110 comprises Al/Ni—V alloy/Cu.

Figure 1C:
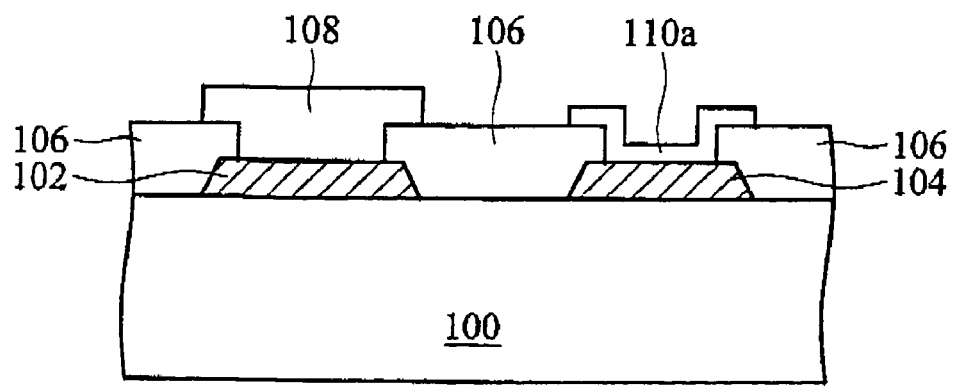

Next, as shown in FIG. 1C, lithography and etching are performed to partially remove the UBM layer 110, thereby leaving a portion of UBM layer 110a over the second metal pad 104 and partially covering the passivation layer 106.

Figure 1D:
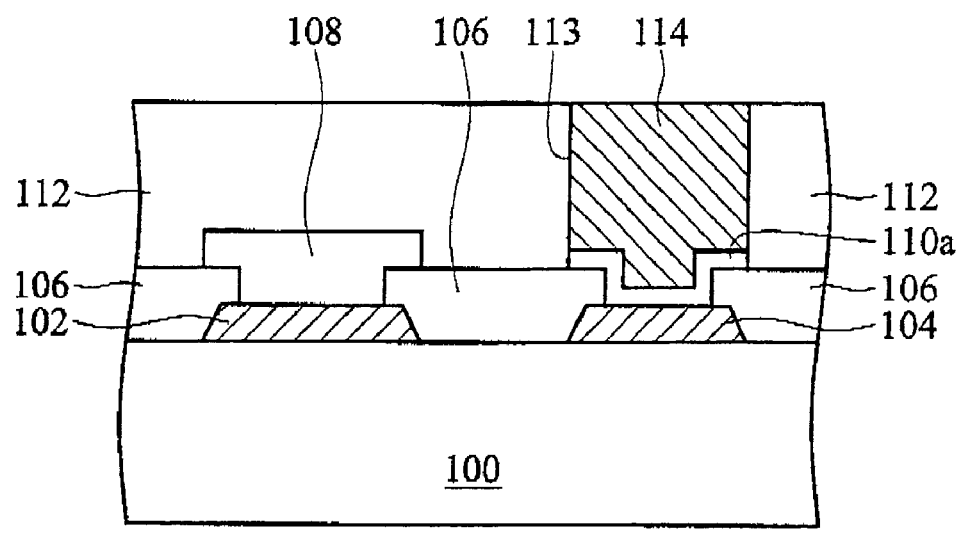

Next, as shown in FIG. 1D, a photoresist layer (not shown), such as a dry film or a wet photoresist layer, is formed overlying the wafer 100 to cover the capping layer 108, the passivation layer 106, and the UBM layer 110a. Thereafter, lithography is performed on the photoresist layer to form a photoresist pattern layer 112 having an opening 113 therein, exposing the UBM layer 110a over the second metal pad 104. Thereafter, the opening 113 is filled with a conductive material 114, such as tin (Sn), SnPb, lead-free solder, or the like, by printing.

Figure 1E:
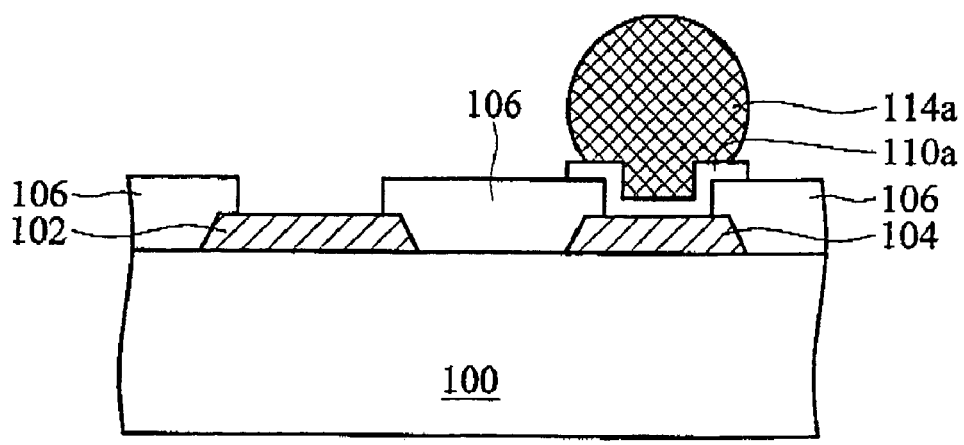

Finally, as shown in FIG. 1E, a reflow process is performed, such that the conductive material 114 forms a ball-shaped solder bump 114a due to surface tension. The photoresist pattern layer 112 is subsequently removed. Note that the photoresist pattern layer 112 may be removed prior to the reflow process. The capping layer 108 is then removed to expose the first metal pad 102 for subsequent wire bonding.

Second embodiment

Figure 2A:
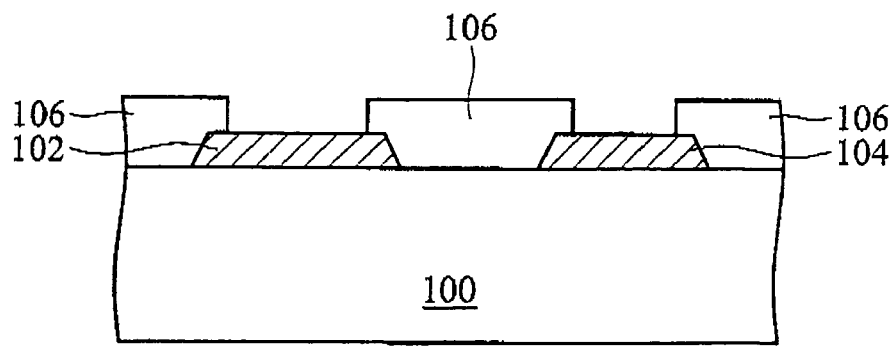
FIGS. 2A to 2E are cross-sections of a method for forming a wafer structure of a second embodiment of the invention.

FIGS. 2A to 2E illustrate a method for forming a wafer structure of a second embodiment of the invention, wherein the same reference numbers are used in the drawings. First, as shown in FIG. 2A, a wafer 100, such as silicon or other semiconductor material, is provided. As mentioned in the first embodiment, the wafer 100 comprises at least one first metal pad 102, at least one second metal pad 104, and a passivation layer 106 thereon. The first and second metal pads 102 and 104 comprise aluminum or copper. In this embodiment, the first metal pad 102 acts as a wire bonding pad and the second metal pad 104 a bumping pad. The passivation layer 106 substantially exposes the first and second metal pads 102 and 104. The passivation layer 106 may comprise polyimide (PI) or silicon nitride formed by PECVD (PE nitride).

Figure 2B:
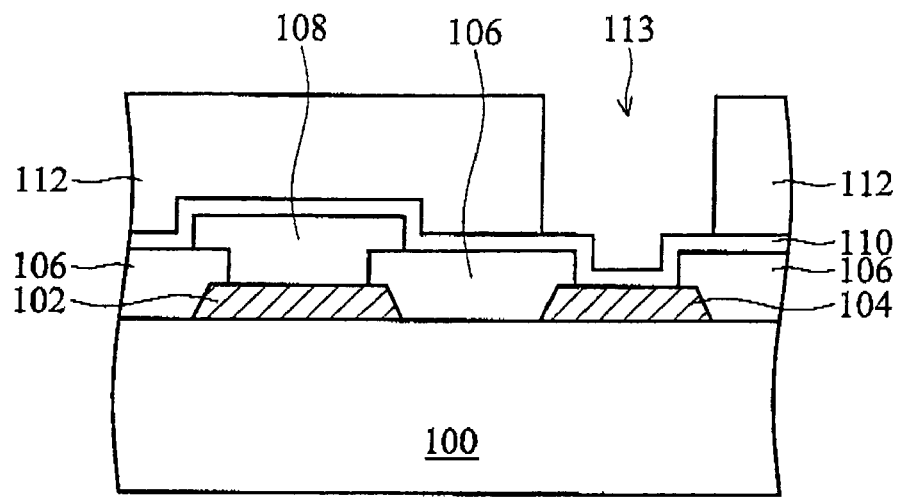

Next, as shown in FIG. 2B, a capping layer (not shown) is formed overlying the wafer 100 to cover the exposed first and second metal pads 102 and 104. Thereafter, lithography and etching are performed on the capping layer to leave a portion of the capping layer 108 over the first metal pad 102, which partially covers the passivation layer 106. In this embodiment, the remaining capping layer 108 may comprise polymer or metal. For example, the capping layer 108 comprising polymer may have a thickness of more than 2000 Å. Moreover, the capping layer 108 comprising metal, such as titanium (Ti), nickel (Ni), vanadium (V), or alloys thereof, may have a thickness of more than 500 Å. Moreover, as mentioned in the first embodiment, the selected metal for the capping layer 108 is preferably different from the first metal pad 102 and the subsequent under bump metallurgy (UBM) layer.

A metal layer 110 acting as an UBM layer is formed overlying the wafer 100 by, for example, sputtering or CVD, to cover the exposed second metal pad 104, the passivation layer 106, and the capping layer 108. Generally, the UBM layer 110 may be a multiple metal layer comprising an adhesion layer, a barrier layer, and a wetting layer. In order to simplify the diagram, a single layer is depicted. In this embodiment, the material of the UBM layer 110 may comprise titanium (Ti), chromium (Cr), nickel (Ni), vanadium (V), copper (Cu), aluminum (Al), aurum (Au), or alloys thereof. Preferably, the UBM layer 110 comprises Al/Ni—V alloy/Cu.

Next, a photoresist layer (not shown), such as a dry film or a wet photoresist layer, is formed overlying the UBM layer 110. Thereafter, lithography is performed on the photoresist layer to form a photoresist pattern layer 112 having an opening 113 therein, exposing the UBM layer 110 over the second metal pad 104.

Figure 2C:
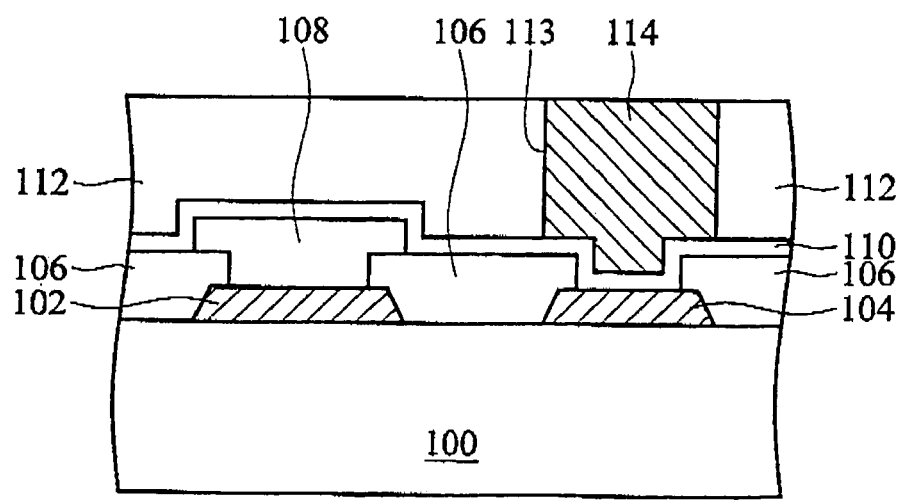
Figure 2D:
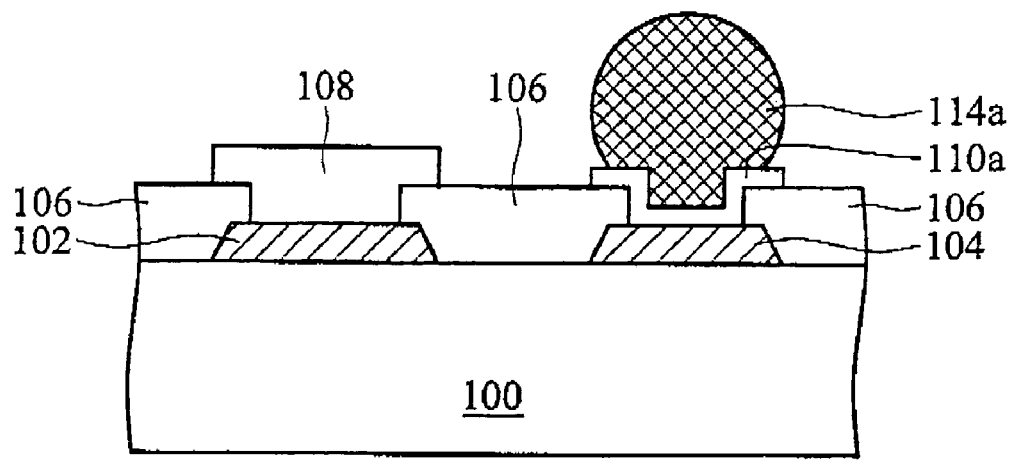

Next, as shown in FIG. 2C, the opening 113 is filled with a conductive material 114, such as tin (Sn), SnPb, lead-free solder, or the like, by electroplating or printing.

Next, as shown in FIG. 1D, a reflow process is performed, such that the conductive material 114 forms a ball-shaped solder bump 114a due to surface tension. The photoresist pattern layer 112 is subsequently removed. Note that the photoresist pattern layer 112 may be removed prior to the reflow process.

Next, the UBM layer 110 uncovered by the solder bump 114a is removed by etching using the solder bump 114a as a mask, leaving a portion of UBM layer 110a over the second metal pad 104.

Figure 2E:
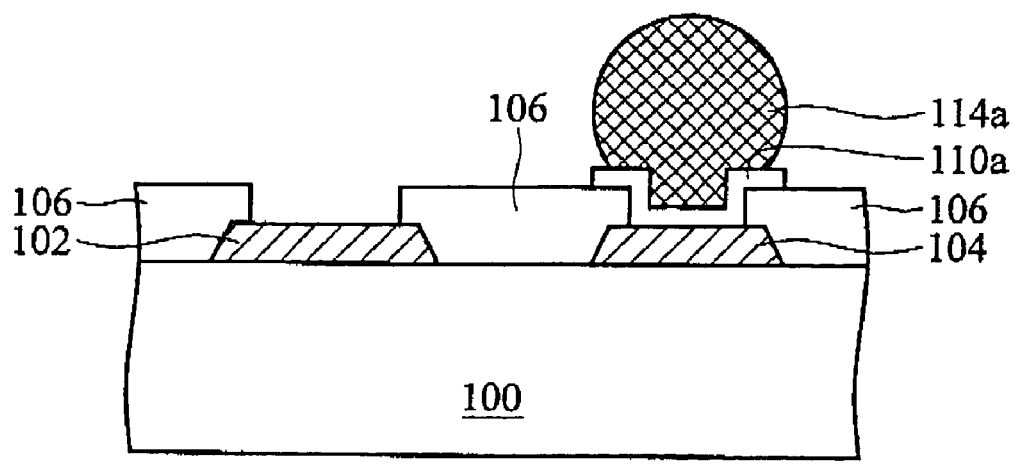

Finally, as shown in FIG. 2E, the capping layer 108 is removed to expose the first metal pad 102 for subsequent wire bonding.

Figure 3:
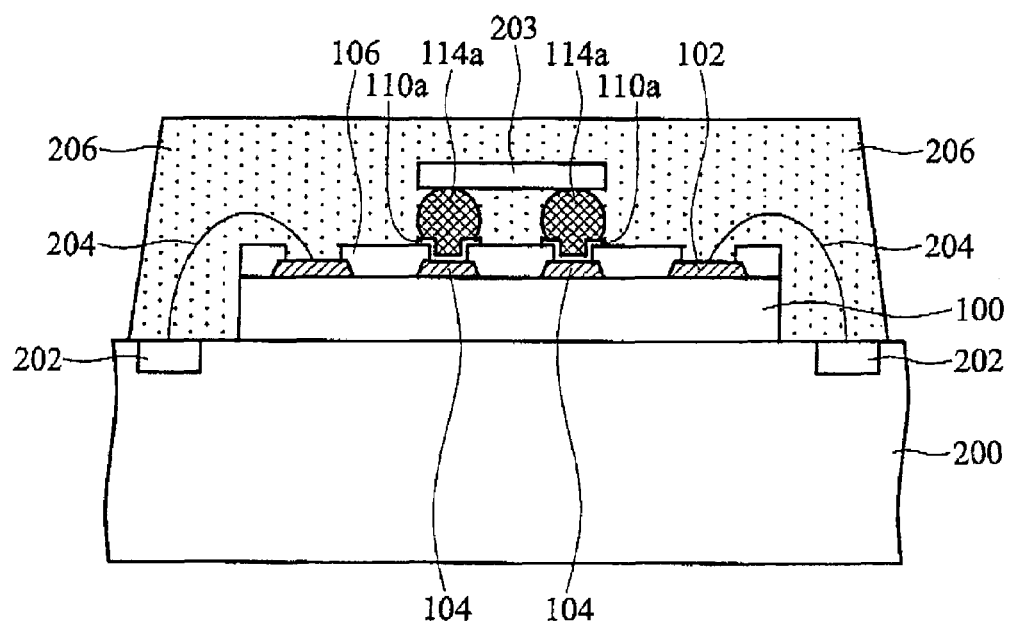
FIG. 3 illustrates a passive component mounted on the wafer structure shown in FIGS. 1E and 2E.

FIG. 3 illustrates a passive component mounted on the wafer structure shown in FIGS. 1E and 2E. First, the wafer structure of the first or second embodiment is disposed on a package substrate 200 having pads 202 thereon. The wafer structure comprises a wafer 100 having wire bonding pads 102 and bumping pads 104, a passivation layer 106 overlying the wafer 100, and a URM layer 110a and an overlying solder bump 114a on each bumping pad 104. Next, a passive component 203, such as resistor, inductor, or capacitor, is provided, which has electrodes (not shown) on both ends. Thereafter, the passive component 203 is mounted on the wafer 100 through the electrodes and the solder bump 114a.

Wire bonding is then performed, such that the wafer 100 is electrically connected to the package substrate 200 by the wire 204 between the wire bonding pad 102 and the pad 202. Finally, encapsulating is performed, thereby covering the passive component 203, the wire 204, and the wafer structure with an underfill 206.

According to embodiments of the invention, since the passive component is mounted on the wafer by the solder bump, rather than on the package substrate, the signal transmission path can be effectively reduced, thereby eliminating RC delay effect. That is, the performance of the semiconductor device is improved. Moreover, since the size of the package substrate can be reduced due to mounting the passive component on the wafer, the demand for lightweight and thin profile electronic products can be obtained.

While the invention has been described by way of example and in terms of preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for mounting a passive component on a wafer, comprising:
    providing a wafer having at least one first metal pad, at least one second metal pad, and a passivation layer thereon, the passivation layer exposing the first and second metal pads;
    forming a capping layer on the exposed first metal pad;
    forming a metal layer overlying the wafer to cover the capping layer, the passivation layer, and the exposed second metal pad;
    patterning the metal layer to form an under ball metallurgy layer over the second metal pad;
    forming a photoresist pattern layer overlying the wafer to cover the capping layer and the passivation layer and expose the under ball metallurgy layer;
    forming a solder bump on the exposed under ball metallurgy layer;
    successively removing the photoresist pattern layer and the capping layer to expose the first metal pad; and
    mounting a passive component on the wafer through the solder bump.

2. The method as claimed in claim 1, wherein the first metal pad acts as a wire bonding pad and the second metal pad as a bumping pad.

3. The method as claimed in claim 1, wherein the capping layer comprises polymer.

4. The method as claimed in claim 3, wherein the capping layer has a thickness of substantially more than 2000 Å.

5. The method as claimed in claim 1, wherein the capping layer comprises metal.

6. The method as claimed in claim 5, wherein the capping layer comprises titanium, nickel, vanadium, or alloys thereof.

7. The method as claimed in claim 5, wherein the capping layer has a thickness of substantially more than 500 Å.

8. The method as claimed in claim 1, wherein the under ball metallurgy layer comprises titanium, chromium, nickel, vanadium, copper, aluminum, aurum, or alloys thereof.

9. The method as claimed in claim 1, wherein the formation of the solder bump comprises:
    forming a conductive material on the under ball metallurgy layer by printing; and
    performing a reflow process on the conductive material to form the solder bump.

10. The method as claimed in claim 9, wherein the conductive material comprises tin.

11. A method for mounting a passive component on a wafer comprising:
    providing a wafer having at least one first metal pad, at least one second metal pad, and a passivation layer thereon, the passivation layer exposing the first and second metal pads;
    forming a capping layer on the exposed first metal pad;
    forming a metal layer overlying the wafer to cover the capping layer, the passivation layer, and the exposed second metal pad;
    forming a photoresist pattern layer on the metal layer, which exposes the metal layer over the second metal pad;
    forming a solder bump on the exposed metal layer;
    removing the photoresist pattern layer;
    removing the metal layer uncovered by the solder bump to form an under ball metallurgy layer over the second metal pad;
    removing the capping layer to expose the first metal pad; and
    mounting a passive component on the wafer through the solder bump.

12. The method as claimed in claim 11, wherein the first metal pad acts as a wire bonding pad and the second metal pad as a bumping pad.

13. The method as claimed in claim 11, wherein the capping layer comprises polymer.

14. The method as claimed in claim 13, wherein the capping layer has a thickness of substantially more than 2000 Å.

15. The method as claimed in claim 11, wherein the capping layer comprises metal.

16. The method as claimed in claim 15, wherein the capping layer comprises titanium, nickel, vanadium, or alloys thereof.

17. The method as claimed in claim 15, wherein the capping layer has a thickness of substantially more than 500 Å.

18. The method as claimed in claim 11, wherein the under ball metallurgy layer comprises titanium, chromium, nickel, vanadium, copper, aluminum, aurum, or alloys thereof.

19. The method as claimed in claim 11, wherein the formation of the solder bump comprises:
    forming a conductive material on the under ball metallurgy layer by electroplating; and
    performing a reflow process on the conductive material to form the solder bump.

20. The method as claimed in claim 19, wherein the conductive material comprises tin.

* * * * *